United States Patent
Mäki (10) Patent No.: US 11,595,733 B2
(45) Date of Patent: Feb. 28, 2023

(54) ARRANGEMENT FOR ALIGNING UPSTREAM PATH

(71) Applicant: Teleste Oyj, Littoinen (FI)

(72) Inventor: Kari Mäki, Turku (FI)

(73) Assignee: TELESTE OYJ, Littoinen (FI)

(*) Notice: Subject to any disclaimer, the term of this patent is extended or adjusted under 35 U.S.C. 154(b) by 0 days.

(21) Appl. No.: 17/721,559

(22) Filed: Apr. 15, 2022

(65) Prior Publication Data

US 2022/0345788 A1 Oct. 27, 2022

(30) Foreign Application Priority Data

Apr. 23, 2021 (FI) ..................................... 20215478

(51) Int. Cl.
 H04N 7/173 (2011.01)
 H04N 21/61 (2011.01)
(52) U.S. Cl.
 CPC ....... H04N 21/6168 (2013.01); H04N 21/615 (2013.01)
(58) Field of Classification Search
 CPC .. H04N 21/615; H04N 21/6168; H04N 7/102; H04B 3/04; H04B 3/20; H04B 3/23; H04B 3/36
 See application file for complete search history.

(56) References Cited

U.S. PATENT DOCUMENTS

| | | | |
|---|---|---|---|
| 6,836,184 B1 | 12/2004 | Daughtry et al. | |
| 2008/0074731 A1* | 3/2008 | Takeyama | H01S 3/06758 359/333 |
| 2008/0094692 A1* | 4/2008 | Yoshida | H04B 10/564 359/341.42 |
| 2018/0138878 A1 | 5/2018 | Domino et al. | |
| 2021/0013924 A1 | 1/2021 | Kliger et al. | |

FOREIGN PATENT DOCUMENTS

| | | |
|---|---|---|
| EP | 0 928 063 | 5/2001 |
| EP | 1 936 977 | 6/2008 |

OTHER PUBLICATIONS

Finnish Patent Application No. 20215478, filed Apr. 23, 2021, Office Action and Search Report dated Oct. 20, 2021, 8 pages.
European Patent Application No. 22165776.0, Extended European Search Report and Written Opinion dated Sep. 6, 2022, 12 pages.

* cited by examiner

*Primary Examiner* — Gigi L Dubasky
(74) *Attorney, Agent, or Firm* — Mueting Raasch Group (57) ABSTRACT

A network element of a cable television network includes at least a first and a second upstream amplifier stage, a first attenuator and a first equalizer between the first and the second amplifier stage, and a second attenuator after the second upstream amplifier stage in upstream signal path direction. A target value is determined for total attenuation of the components of the amplifier. The total attenuation is a sum of attenuations of the first attenuator, the first equalizer, and the second attenuator. The attenuation of the first equalizer is preset. The attenuation of the first attenuator is set to a maximum value such the sum of the attenuations of the first attenuator and the first equalizer is below a first threshold value. The attenuation of the second attenuator is set such that the total attenuation reaches the target value.

14 Claims, 3 Drawing Sheets

Determine a target value for total attenuation of the components of the amplifier, wherein the total attenuation is a sum of attenuations of the first attenuator (A1), the first equalizer (S1) and the second attenuator (A2), wherein the attenuation of the first equalizer (S1) is preset (300)

↓

Set the attenuation A1 to a maximum value such the sum of the attenuations A1 +S1 is below a first threshold value (302)

↓

Set the attenuation A2 such that the total attenuation reaches the target value (304)

↓

Provide an output signal from the output of the amplifier (306)

↓

Adjust, in response to a frequency response of the output signal deviating from a predetermined value, the attenuation S1 to compensate for said deviation (308)

↓

Adjust the attenuation A1 to a maximum value such the sum of A1+S1 is below said first threshold value (310)

↓

Adjust the attenuation A2 such that the total attenuation reaches the target value (312)

ARRANGEMENT FOR ALIGNING UPSTREAM PATH

RELATED APPLICATION

This application claims the benefit of priority under 35 U.S.C. § 119(a) to FI Application No. 20215478, filed 23 Apr. 2021, the disclosure of which is incorporated by reference herein in its entirety.

FIELD OF THE INVENTION

The invention relates to cable television (CATV) networks, and especially to an arrangement for aligning upstream path components of a CATV network element.

BACKGROUND

CATV networks may be implemented with various techniques and network topologies, but currently most cable television networks are implemented as so-called HFC networks (Hybrid Fiber Coax), i.e. as combinations of a fibre network and a coaxial cable network.

Data Over Cable Service Interface Specification (DOCSIS) is a CATV standard providing specifications for high-bandwidth data transfer in an existing CATV system. The latest versions DOCSIS 3.1 and 4.0 enable the cable network operators to significantly increase both the downstream and upstream data throughput using the existing HFC networks. One issue relating to the introduction of DOCSIS 3.1 and the forthcoming 4.0 is the need to eventually adjust the frequency range and the bandwidth of the communication channels. To support the various DOCSIS standard versions, CATV amplifiers typically need to support several different upstream-downstream frequency splits, such as 42/54 MHz, 65/85 MHz, 85/108 MHz, 204/258 MHz, 300/372 MHz, 396/492 MHz, 492/606 MHz or 684/834 MHz.

Due to the relatively low frequency range of the traditionally used upstream channels (i.e. below 65 MHz or at least below 204 MHz), the alignment of upstream path components of the CATV amplifier has been rather simple. However, due to the introduction of significantly higher frequency ranges for upstream channels in DOCSIS 3.1 and especially in 4.0, up to even 684 MHz, the attenuation in the coaxial cable may increase significantly. This causes challenges for adjusting the gain, slope and/or attenuation parameters of the upstream channel components of the CATV amplifier such that the signal-to-noise ratio (SNR) of the upstream signal remains good.

Therefore, an improved arrangement is needed for aligning the upstream path components in CATV amplifiers.

BRIEF SUMMARY

Now, an improved arrangement has been developed to reduce the above-mentioned problems. As aspects of the invention, we present a method and a network element of a cable television network, which are characterized in what will be presented in the independent claims.

The dependent claims disclose advantageous embodiments of the invention.

According to a first aspect of the invention, there is provided a method for controlling upstream signal path components of an amplifier of a cable television (CATV) network element, wherein the upstream signal path components comprise at least a first and a second amplifier stage, a first attenuator and a first equalizer between the first and the second amplifier stage, and a second attenuator after the second amplifier stage in upstream signal path direction, the method comprising: determining a target value for total attenuation of the components of the amplifier, wherein the total attenuation is a sum of attenuations of the first attenuator, the first equalizer, and the second attenuator, wherein the attenuation of the first equalizer is preset; setting the attenuation of the first attenuator to a maximum value such the sum of the attenuations of the first attenuator and the first equalizer is below a first threshold value; setting the attenuation of the second attenuator such that the total attenuation reaches the target value; and providing an output signal from the output of the amplifier.

According to an embodiment, the method comprises adjusting, in response to a frequency response of the output signal deviating from a predetermined slope value, the attenuation of the first equalizer to compensate for said deviation; and adjusting the attenuation of the first attenuator to a maximum value such the sum of the attenuations of the first attenuator and the first equalizer is below said first threshold value; adjusting the attenuation of the second attenuator such that the total attenuation reaches the target value.

According to an embodiment, the upstream signal path components further comprise a second equalizer having a preset attenuation affecting to the total attenuation and a maximum allowable value is set for the attenuation of the first equalizer, wherein the method comprises adjusting, in response to a frequency response of the output signal deviating from a predetermined slope value and the attenuation of the first equalizer has reached its maximum allowable value, the attenuation of the second equalizer to compensate for said deviation; adjusting the attenuation of the first attenuator to a maximum value such the sum of the attenuations of the first attenuator and the first equalizer is below said first threshold value; and adjusting the attenuation of the second attenuator such that the total attenuation reaches the target value.

According to an embodiment, the method comprises adjusting, prior to determining the target value for the total attenuation, a sum of a gain of the first amplifier stage and a gain of the second amplifier stage total gain of the amplifier to a predetermined level.

According to an embodiment, said first threshold value is lower than the gain of the first amplifier stage.

According to an embodiment, said target value for the total attenuation of the components of the amplifier is determined at low frequencies of the upstream frequency band, such as within a range of 5-65 MHz.

According to a second aspect of the invention, there is provided a network element of a cable television (CATV) network, said network element comprising at least a first and a second upstream amplifier stage, a first attenuator and a first equalizer between the first and the second amplifier stage, and a second attenuator after the second upstream amplifier stage in upstream signal path direction; means for determining a target value for total attenuation of the components of the amplifier, wherein the total attenuation is a sum of attenuations of the first attenuator, the first equalizer, and the second attenuator, wherein the attenuation of the first equalizer is preset; means for setting the attenuation of the first attenuator to a maximum value such the sum of the attenuations of the first attenuator and the first equalizer is below a first threshold value; means for setting the attenuation of the second attenuator such that the total attenuation reaches the target value; and means for providing an output signal from the output of the amplifier.

According to a third aspect, there is provided a computer readable storage medium stored with code thereon for use by an apparatus, which when executed by a processor, causes the apparatus to perform the above method and the related embodiment.

These and other aspects, embodiments and advantages will be presented later in the detailed description of the invention.

BRIEF DESCRIPTION OF THE DRAWINGS

The invention will now be described in more detail in connection with preferred embodiments with reference to the appended drawings, in which.

DETAILED DESCRIPTION OF THE EMBODIMENTS

Figure 1:
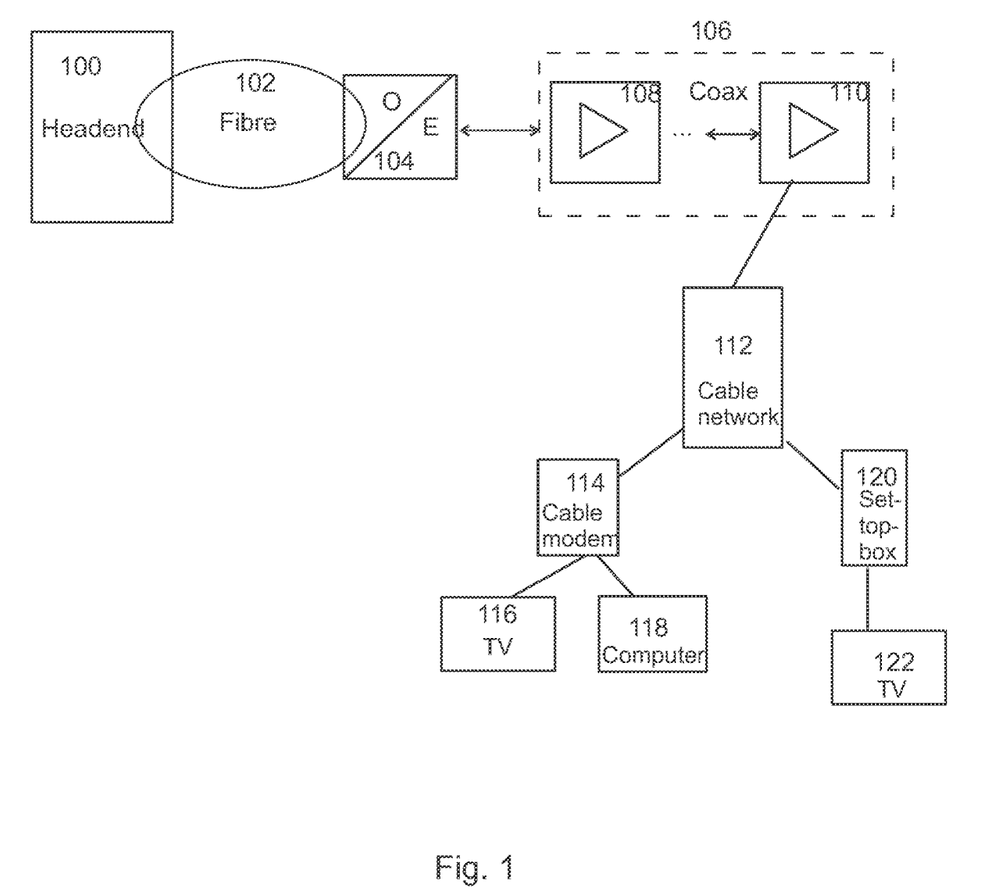
FIG. 1 shows the general structure of a typical HFC network.

FIG. 1 shows the general structure of a typical HFC network. Program services are introduced from the main amplifier 100 (a so-called headend or CCAP) of the network via an optical fibre network 102 to a fibre node 104, which converts the optical signal to an electric signal to be relayed further in a coaxial cable network 106. Such a node 104 can be an analogue node or a so-called RPD/RMD node. Depending on the length, branching, topology, etc. of the coaxial cable network, this coaxial cable segment typically comprises one or more broadband amplifiers 108, 110 for amplifying program service signals in a heavily attenuating coaxial media. From the amplifier the program service signals are introduced to a cable network 112 of a smaller area, such as a distribution network of an apartment building, which are typically implemented as coaxial tree or star networks comprising signal splitters for distributing the program service signals to each customer. The cable network 112, such as the distribution network of an apartment, may further comprise a Network Interface Unit (NIU) or Point of Entry (PoE) device arranged to divide signals to appropriate home appliances. The NIU may operate as a home amplifier. From a wall outlet the signal is further relayed either via a cable modem 114 to a television receiver 116 or a computer 118, or via a so-called set-top box 120 to a television receiver 122.

The HFC network may be implemented according to various standards. In Europe, video transmission in the HFC networks have traditionally been implemented according to DVB-C (Digital Video Broadcasting—Cable) standard, but currently there is an on-going shift to more widely use the DOCSIS (Data Over Cable Service Interface Specification) standard.

DOCSIS is a CATV standard providing specifications for high-bandwidth data transfer in an existing CATV system. DOCSIS may be employed to provide Internet access over existing hybrid fiber-coaxial (HFC) infrastructure of cable television operators. DOCSIS has been evolved through versions 1.0, 1.1, 2.0, 3.0 and 3.1 to the latest version of 4.0.

When implementing the HFC network of FIG. 1 according to DOCSIS, the headend 100 of the CATV network comprises inputs for signals, such as TV signals and IP signals, a television signal modulator and a cable modem termination system (CMTS). The CMTS provides high-speed data services to customers thorough cable modems (CM; 114) locating in homes. The CMTS forms the interface to the IP-based network over the Internet. It modulates the data from the Internet for downstream transmission to homes and receives the upstream data from homes. The CMTS additionally manages the load balancing, error correction parameters and the class of service (CoS).

Signals from the headend 100 are distributed optically (fiber network 102) to within the vicinity of individual homes, where the optical signals are converted to electrical signals at the terminating points 104. The electrical signals are then distributed to the various homes via the existing 75 ohm coaxial cables 106. The maximum data transfer of the coaxial cables is limited due to strong frequency-based attenuation. Therefore, the electrical signals transmitted over coaxial cables must be amplified. The amplifiers 108, 110 used for this purpose are suited to a specific frequency range. In addition, the upstream and downstream must occur over the same physical connection. The last part 112 of the coaxial connection between the CMTS and the CMs branches off in a star or a tree structure. A CMTS transmits the same data to all CMs located along the same section of cable (one-to-many communications). A request/grant mechanism exists between the CMTS and the CMs, meaning that a CM needing to transmit data must first send a request to the CMTS, after which it can transmit at the time assigned to it.

Depending on the version of DOCSIS used in the CATV network, there is a great variety in options available for configuring the network. For the downstream channel width, all versions of DOCSIS earlier than 3.1 use either 6 MHz channels (e.g. North America) or 8 MHz channels (so-called "EuroDOCSIS"). However, the upstream channel width may vary between 200 kHz and 3.2 MHz (versions 1.0/1.1), and even to 6.4 MHz (version 2.0).

DOCSIS 3.1 specifications support capacities of at least 10 Gbit/s downstream and 1 Gbit/s upstream using 4096 QAM. DOCSIS 3.1 rejects the 6 or 8 MHz wide channel spacing and uses narrower orthogonal frequency-division multiplexing (OFDM) subcarriers being 20 kHz to 50 kHz wide, which sub-carriers can be combined within a block spectrum of maximum of 192 MHz wide.

DOCSIS 3.1 further provides the concept of Distributed CCAP Architecture (DCA). Converged Cable Access Platform (CCAP) may be defined as an access-side networking element or set of elements that combines the functionality of a CMTS with that of an Edge QAM (i.e. the modulation), providing high-density services to cable subscribers. Conventionally, the CCAP functionalities have been implemented in the headend/hub, such as the headend 100 in FIG. 1. In a DCA, some features of the CCAP are distributed from headend/hub to the network elements closer to the customers, for example to the fibre nodes 104 in FIG. 1. The CCAP functionalities left to be implemented in the headend/hub may be referred to as CCAP core.

DOCSIS 3.1 specifies at least two network element concepts, i.e. a Remote PHY Device (RPD) and a Remote-MACPHY Device (RMD), to which some functionalities of the headend can be distributed. A recent version of DOCSIS 3.1 specification also provided Annex F introducing a Full Duplex DOCSIS 3.1 technology, where a new distributed access node called Full Duplex (FDX) Node is determined. These network elements implementing at least part of the CCAP functionalities may be referred to as DCA nodes.

One issue relating to the introduction of DOCSIS 3.1 and 4.0 is the need to eventually adjust the frequency range and the bandwidth of the communication channels to meet the requirements of faster communication. The older DOCSIS standards up to the version 3.0 provide an upstream bandwidth of 5-42 MHz (in Americas) or 5-65 MHz (in Europe) and a downstream bandwidth of 85-862 MHz or even up to 1.0 GHz. DOCSIS 3.1 introduces a downstream band up to 1218 MHz. In DOCSIS 3.1, the upper frequency edge of the upstream bandwidth is raised to 204 MHz, causing the lower frequency edge of the downstream bandwidth to be raised to 258 MHz. DOCSIS 4.0 will shift the upper frequency edge of the upstream bandwidth even to 684 MHz, whereupon the lower frequency edge of the downstream bandwidth to be raised to 834 MHz.

However, regardless of CATV standard underlying the HFC network, the operational principle of the RF amplifiers, such as the amplifiers 108, 110, is similar in that sense that they must be capable of two-way transmission and amplification of both downstream and upstream (a.k.a. forward path and return path) signals.

To support the various DOCSIS standard versions, CATV amplifiers typically need to support several different upstream-downstream frequency splits, such as 42/54 MHz, 65/85 MHz, 85/108 MHz, 204/258 MHz, 300/372 MHz, 396/492 MHz, 492/606 MHz or 684/834 MHz. This may be actualized, for example, with one or more diplex filters, such as plug-in diplex filters, and return path modules for each individual split.

Due to the relatively low frequency range of the traditionally used upstream channels (i.e. below 65 MHz or at least below 204 MHz), the alignment of upstream path components of the CATV amplifier has been rather simple. However, due to the introduction of significantly higher frequency ranges for upstream channels in DOCSIS 3.1 and especially in 4.0, up to even 684 MHz, the attenuation in the coaxial cable may increase significantly. This causes challenges for adjusting the gain, slope and/or attenuation parameters of the upstream channel components of the CATV amplifier such that the signal-to-noise ratio (SNR) of the upstream signal remains good.

Typically, most of the return paths of the CATV amplifiers are configured to align gain and slope at the output such that the next CATV amplifier along the network has input signal with a fixed signal level and a flat frequency response. The CATV amplifiers typically have an input amplifier stage and an output amplifier stage provided with an output attenuator and an output equalizer, but there are no mid-stage controls. The output amplifier stage is typically configured to provide a maximum signal level, because the input level of the next CATV amplifier along the network is fixed. However, operating the output amplifier stage close to its maximum values typically causes high power consumption, as well as distortion products possibly degrading the output signal quality.

Figure 2:
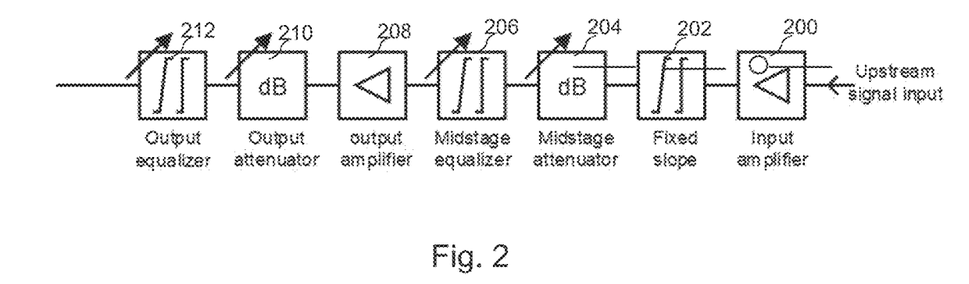
FIG. 2 shows a simplified block chart illustrating some upstream path components of a CATV amplifier.

The challenges could be addressed by introducing the return path components of the CATV amplifier with so-called mid-stage control units. FIG. 2 shows an example of some return path (i.e. upstream) components of the CATV amplifier, where the upstream signal is provided to an input amplifier stage 200. The amplified input signal is fed to a fixed slope control unit 202. The return path comprises a mid-stage attenuator 204 and an optional mid-stage equalizer 206. Thereafter, the signal is amplified by an output amplifier stage 208, and adjusted by an output attenuator 210 and an output equalizer 212. Now the attenuation is divided in two different units, and maximum level at the output can be avoided by allocating a majority, or at least a significant share, of the attenuation to the mid-stage attenuator. Nevertheless, if there is too much attenuation allocated to the mid-stage attenuator, noise figure NF1 (defined as $10 \log_{10} (SNR_i/SNR_o)$, where $SNR_i$ and $SNR_o$ are the input and output signal-to-noise ratios) of the input amplifier stage may raise too high, thereby indicating a worsening $SNR_o$.

The amount of slope applied by a CATV amplifier on the return path has been traditionally low, because the cable attenuation on 42/65/85/204 MHz return paths is not significant. However, in future higher slope values will be used due to the introduction of higher frequency bandwidths on the return paths, such as up to 684 MHz. If the return path comprises a mid-stage equalizer and if the adjustment for the higher slope value is performed primarily in the mid-stage equalizer, the noise figure NF of the whole upstream amplifier path at the lower frequency edge of upstream signal bandwidth may become high, since the noise figure NF2 of the output amplifier stage has more impact. It is noted that noise figure NF2 of the output amplifier stage has no practical role as long as the input level for output amplifier is significantly higher than input level of input amplifier.

It can be concluded that for achieving a minimal loading of the output amplifier stage, there is an optimization task of allocating as great share of the attenuation as possible to the mid-stage attenuator without allowing NF of the whole upstream amplifier path to increase too much.

Nevertheless, such a trade-off is very difficult, maybe even impossible, to achieve in practical adjustments. A field technician aiming to align the return path of a CATV amplifier having a fixed slope, and a mid-stage equalizer and a mid-stage attenuator used in mid-stage position will inevitably face great challenges in aligning the amplifier so that there is optimal amount of attenuation and slope used in mid-stage. The alignments of both the mid-stage equalizer and the mid-stage attenuator create attenuation at low frequencies and there is a risk that SNR at the low edge of the return path frequency band may be ruined.

Therefore, an improved arrangement is presented herein for aligning the upstream amplifier components in CATV network elements.

Figure 3:
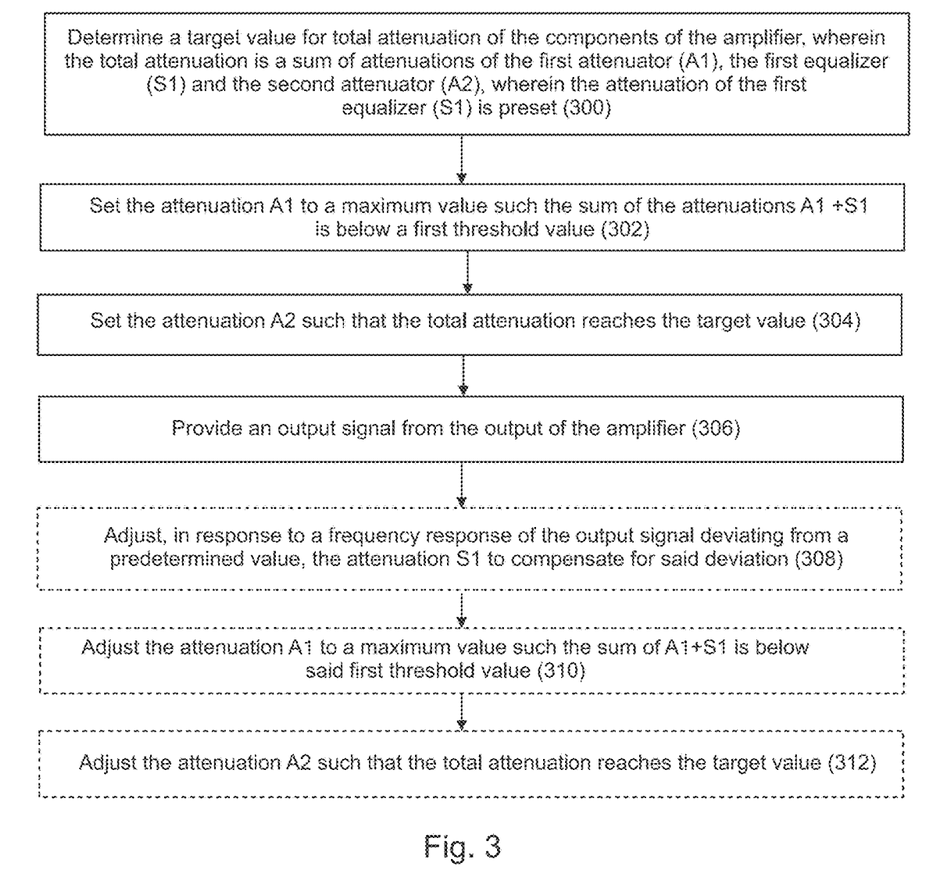
FIG. 3 shows a flow chart of a method according to some embodiments of the invention.

According to a first aspect, there is provided a method for controlling upstream signal path components of an amplifier of a cable television (CATV) network element, as illustrated in FIG. 3, wherein the upstream signal path components comprise at least a first and a second amplifier stage, a first attenuator and a first equalizer between the first and the second amplifier stage, and a second attenuator after the second amplifier stage in upstream signal path direction, the method comprising: determining (300) a target value for total attenuation of the components of the amplifier, wherein the total attenuation is a sum of attenuations of the first attenuator (A1), the first equalizer (S1), and the second attenuator (A2), wherein the attenuation of the first equalizer (S1) is preset; setting (302) the attenuation of the first attenuator (A1) to a maximum value such the sum of the attenuations of the first attenuator (A1) and the first equalizer (S1) is below a first threshold value; setting (304) the attenuation of the second attenuator (A2) such that the total attenuation reaches the target value; and providing (306) an output signal from the output of the amplifier.

Herein, the first attenuator and the first equalizer may refer, for example, to the mid-stage attenuator and the mid-stage equalizer, and the second attenuator may refer, for example, to the output attenuator, as shown in FIG. 2. It is noted that the CATV amplifier may further comprise the output equalizer, as shown in FIG. 2, as a second equalizer, but this is not mandatory. Accordingly, when adjusting the gain of the CATV amplifier in view of aiming to provide the next CATV amplifier in the network with an input signal with a fixed signal level and a flat frequency response, there typically arises a need to adjust the attenuation provided by the upstream components. Thus, a target value is determined for the total attenuation of the components of the amplifier, wherein the target value may be such that the output signal of CATV amplifier reaches a predetermined signal level.

Herein, the predetermined signal level of the output signal may be linked to the desired level of the input signal to the next CATV amplifier in the network. That is, when applying the unity gain method in the amplifier alignment, the purpose is to provide the next CATV amplifier with an input signal with a fixed signal level equal to the input signal level of the previous CATV amplifier and with a flat frequency response. Since the coaxial cable and possible other components between the CATV amplifiers inevitably cause some attenuation, the predetermined signal level of the output signal is preferably higher than desired input signal level of the CATV amplifiers so as to compensate the attenuation.

The total attenuation is a sum of attenuation components provided by the first attenuator, the first equalizer, the second attenuator and the optional second equalizer. The attenuation components of the first attenuator and the second attenuator, i.e. A1 and A2, are not frequency-dependent, i.e. they typically attenuate same amount over the whole frequency band, wherein the amount of attenuation between A1 and A2 may naturally vary. The attenuation components of the first equalizer and the optional second equalizer, i.e. S1 and S2, are frequency-dependent such that the lower frequencies have the highest attenuation and the highest frequency has typically 0 dB attenuation. The equalizers have a frequency response, a.k.a. slope or tilt, that is opposite to a normal attenuation curve of a coaxial cable. In the method, the attenuations of the first equalizer (S1) and the second equalizer (S2) may be initially preset to a default value. Thus, the total attenuation may be defined as $A_{tot}=A1+S1+A2 (+S2)$.

Now, the attenuation of the first attenuator (A1) is set to a maximum value such the sum of the attenuations of the first attenuator (A1) and the first equalizer (S1) is below a first threshold value, and the attenuation of the second attenuator (A2) is set such that the total attenuation reaches the target value.

Hence, the CATV amplifier can be aligned in a more optimal way by using the mid-stage controls and their attenuations S1 and A1 together with the output controls and their attenuations S2 and A2. As a result, the output level of output amplifier stage can be lowered, and the problem created by distortion products and power consumption can be alleviated. If the input level of the output amplifier stage is decreased too much, there is a risk that the noise figure NF2 of the output amplifier stage starts to have negative impact on SNR. This is controlled by preventing the sum of the attenuations of the first attenuator (A1) and the first equalizer (S1) to exceed the first threshold value. In other words, an appropriate balance is controlled between the mid-stage controls S1 and A1 and the output controls S2 and A2.

According to an embodiment, the method further comprises adjusting (308), in response to a frequency response of the output signal deviating from a predetermined slope value, the attenuation of the first equalizer (S1) to compensate for said deviation; adjusting (310) the attenuation of the first attenuator (A1) to a maximum value such the sum of the attenuations of the first attenuator (A1) and the first equalizer (S1) is below said first threshold value; and adjusting (312) the attenuation of the second attenuator (A2) such that the total attenuation reaches the target value.

These optional steps are depicted in FIG. 3 with dashed lines. Thus, in addition to the predetermined output level, the output signal shall also preferably have a predetermined slope value. As described above, when applying the unity gain method in the amplifier alignment, the purpose is to provide the next CATV amplifier with an input signal, besides with a fixed signal level, but also with a flat frequency response. Therefore, in order to compensate for the frequency-dependent attenuation caused at least by the coaxial cable between the CATV amplifiers, the output signal preferably has a compensating predetermined slope value.

If this is not the case, the attenuation of the first equalizer, such as the mid-stage equalizer, may be adjusted to compensate for the deviation in the frequency response. However, considering the above constraints, adjusting the attenuation of the first equalizer (S1) also leads to adjusting the attenuation of the first attenuator to the maximum value such the sum of A1 and S1 is below said first threshold value. Further, the attenuation of the second attenuator (A2) shall be adjusted so that the total attenuation reaches the target value.

According to an embodiment, the upstream signal path components further comprise a second equalizer having a preset attenuation (S2) affecting to the total attenuation and a maximum allowable value is set for the attenuation of the first equalizer (S1), and the method further comprises adjusting, in response to a frequency response of the output signal deviating from the predetermined slope value and the attenuation of the first equalizer (S1) has reached its maximum allowable value, the attenuation of the second equalizer (S2) to compensate for said deviation; adjusting the attenuation of the first attenuator (A1) to a maximum value such the sum of the attenuations of the first attenuator (A1) and the first equalizer (S1) is below said first threshold value; and adjusting the attenuation of the second attenuator (A2) such that the total attenuation reaches the target value.

Thus, the aim of keeping the sum of A1 and S1 to be below said first threshold value may, at least in part, be implemented such that a maximum allowable value is set for the attenuation of the first equalizer (S1). In a case where the slope adjustment provided by the maximum allowable value of S1 does not suffice to correct the frequency response of the output signal to the predetermined slope value, the attenuation of the second equalizer (S2) is increased to compensate for the deviation in the output signal from the predetermined slope value.

According to an embodiment, the method further comprises adjusting, prior to determining the target value for the total attenuation, the sum of the gain (G1) of the first amplifier stage and the gain (G2) of the second amplifier stage of the amplifier to a predetermined level.

Hence, when aiming to provide the next CATV amplifier in the network with an input signal with a fixed signal level, the sum of the gain (G1) of the first amplifier stage and the gain (G2) of the second amplifier stage (G2) of the CATV amplifier, also referred to as the raw gain, is preferably adjusted to a predetermined level. The raw gain G1+G2 is then affected by the applied attenuations, such as A1, A2, S1, S2 as described above, but also by other passive losses on the return path route inside the CATV amplifier. As a result, the operational gain of the CATV amplifier, reflecting to the output signal level, is much lower than the raw gain because of several losses and adjustments.

There is no strict rule of thumb relating allocating the shares of gain between the amplifier stages. For example, the gain of the input amplifier stage (G1) can be made higher than the gain of the output amplifier stage (G2). This enables, in the initial phase of the adjustment process, to ignore the noise figure NF2 of the output amplifier stage as negligible due to the input level for output amplifier being significantly higher than input level of input amplifier. This, in turn, enables to focus to the optimization to allocating as great share of the attenuation as possible to the mid-stage attenuator, and monitoring the possible increase of the noise figure NF1 only. On the other hand, the gain G1 of the input amplifier stage shall not be adjusted too high, since it may create distortion.

According to an embodiment, said first threshold value is lower than the gain of the first amplifier stage (G1). The first threshold value, which is set as the maximum allowable value for the sum of the attenuations of the first attenuator (A1) and the first equalizer (S1), operates to prevent the input level of the output amplifier stage to decrease too much. For ensuring that the input level of the output amplifier stage remains higher than the input level of the input amplifier stage, the first threshold value is set lower than the gain of the first amplifier stage (G1). In simplified terms, it may be said that the sum A1+S1 shall not reach the gain of the first amplifier stage (G1), thereby ensuring that the noise figure NF2 of the output amplifier stage remains to have negligible impact on SNR.

It is, however, noted that the implementation of a CATV amplifier may involve other attenuating elements (in addition to S1 and A1) between the amplifier stages that also create attenuation. Such attenuation elements may involve e.g. a flatness correction unit, a test point, a transponder signal injection point, etc. In practical arrangements, the attenuation of said elements must be taken in account when calculating said sum.

According to an embodiment, said target value for the total attenuation of the components of the amplifier is determined at low frequencies of the upstream frequency band, such as within a range of 5-65 MHz. On one hand, due to the risk of the noise figure NF of the whole upstream amplifier path increases too much especially at the lower edge of the used upstream frequency band, and on the other hand, due to the fact that the slope adjustment of the frequency-dependent equalizers S1 and S2 has more impact at lower frequencies, it is preferable to monitor the attenuation at the lower edge of the used upstream frequency band, and therefore also determine the target value for the total attenuation of the components of the amplifier at low frequencies of the upstream frequency band.

According to a second aspect, there is provided a network element of a cable television (CATV) network, said network element comprising at least a first and a second upstream amplifier stage, a first attenuator and a first equalizer between the first and the second amplifier stage, and a second attenuator after the second upstream amplifier stage in upstream signal path direction; means for determining a target value for total attenuation of the components of the amplifier, wherein the total attenuation is a sum of attenuations of the first attenuator (A1), the first equalizer (S1), and the second attenuator (A2), wherein the attenuation of the first equalizer (S1) is preset; means for setting the attenuation of the first attenuator (A1) to a maximum value such the sum of the attenuations of the first attenuator (A1) and the first equalizer (S1) is below a first threshold value; means for setting the attenuation of the second attenuator (A2) such that the total attenuation reaches the target value; and means for providing an output signal from the output of the amplifier.

Figure 4:
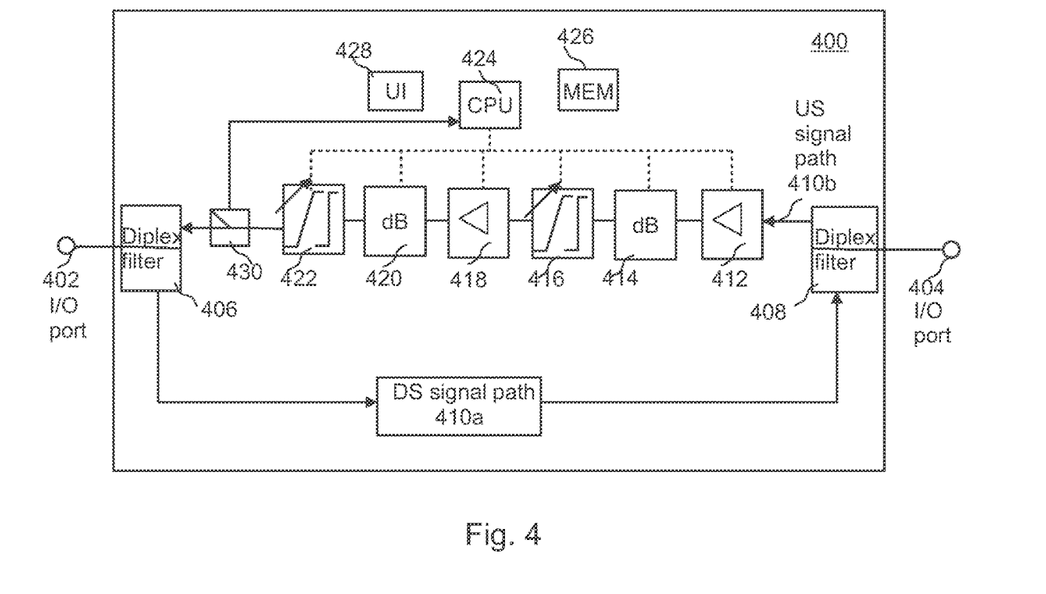
FIG. 4 shows a simplified block chart of a network element according to an embodiment of the invention.

FIG. 4 shows a simplified block chart of a network element (node), wherein the embodiments may be implemented. The node 400 comprises a first input/output port 402, which operates as an input for the downstream signals originating from the headend or the CMTS or the CCAP core and an output for the upstream signals originating from the customer devices. The node 400 further comprises a second input/output port 404, which operates as an output for the downstream signals originating from the headend or the CMTS and an input for the upstream signals originating from the customer devices. Both ports 402, 404 are provided with at least one diplex filter 406 and 408, respectively, for filtering the downstream signals and the upstream signals to their respective frequency bands and splitting the downstream and upstream signals to their own signal routes 410a, 410b travelling at least partly through different components within the node. Most of the internal structure of the network element is irrelevant for the implementation of the embodiments, and therefore especially the components of the downstream signal path are only depicted with the reference number 410a.

The upstream signal path 410b comprises a first upstream amplifier stage 412, which may also be referred to as an input amplifier stage. The upstream signal path 410b comprises a first attenuator 414 and a first equalizer 416, also referred to as mid-stage attenuator and mid-stage equalizer. Then the upstream signal path 410b comprises a second upstream amplifier stage 418, also referred to as an output amplifier stage. A second attenuator 420, also referred to as the output attenuator, is provided after the second upstream amplifier stage 418 in the upstream signal path direction. The exemplified network element of FIG. 4 also shows the optional second equalizer 422, also referred to as the output equalizer.

The network element 400 comprises a control circuit 424 configured to determine a target value for total attenuation of the components of the amplifier. The target value for the total attenuation of the components of the network element is determined that the output signal of CATV amplifier reaches a predetermined signal level. The predetermined signal level, in turn, is preferably such that it provides the next CATV amplifier in the network with an input signal with a fixed signal level. The control circuit 424 may obtain the predetermined signal level e.g. from a memory 426 of the network element, where the predetermined signal level may be stored as a default value. Alternatively, a field technician may supply a value for the predetermined signal level, for example, via the user interface 428 of the network element. The supplied predetermined signal level value may be dependent e.g. on the length of the coaxial cable segment to the next CATV amplifier.

The target value for total attenuation of the upstream components is dependent on the predetermined signal level value at the output and the total gain of the first and the second amplifier stages. For determining the target value, the control circuit 424 may obtain the gain G1 of the first amplifier stage 412 and the gain G2 of the second amplifier stage 418 e.g. directly from the amplifier stages 412, 418 or from the memory 426.

A first threshold value may be e.g. stored in the memory 426, wherein the purpose the first threshold value is to prevent the sum of the attenuations of the first attenuator (A1) and the first equalizer (S1) to exceed a level where the input level of the output amplifier stage is decreased too much. In other words, the purpose is to prevent the noise figure NF2 of the output amplifier stage from having too much negative impact on SNR.

The total attenuation of the upstream components is a sum of attenuations A1, S1, A2 (and possibly S2) of the first attenuator 414, the first equalizer 416, the second attenuator 420 and the optional second equalizer 422, respectively. In the initial stage, the attenuations S1 and S2 of the first and the optional second equalizers are typically preset.

The control circuit 424 is configured to set the attenuation A1 of the first attenuator 414 to a maximum value such the sum of the attenuations A1 and S1 of the first attenuator and the first equalizer is still below the first threshold value. Then the control circuit 424 is configured to set the attenuation A2 of the second attenuator 420 such that the total attenuation reaches the target value. The upstream signal, which is now preferably at the predetermined level, may be supplied via the first diplex filter 406 and the first input/output port 402 towards the next CATV amplifier in the network.

For ensuring that the upstream signal is at the predetermined level, the network element 400 may comprise a sampling unit 430 for sampling the upstream signal, for example, before supplying it to the first diplex filter 406. The sampling unit may be implemented, at simplest, as a directional coupler, for example. The sampling unit 430 provides the control circuit 424 with a sampling signal, based on which the control circuit 424 may determine if further adjustments of first and/or the second attenuators 414,420 is needed. If yes, the control circuit 424 is configured to carry out the further adjustments so as to output the upstream signal at the predetermined level.

In addition to being at the predetermined level, the output upstream signal should preferably have a predetermined slope value so as compensate for the frequency-dependent attenuation caused at least by the coaxial cable between the CATV amplifiers, thereby providing the next CATV amplifier with an input signal, besides with a fixed signal level, but also with a flat frequency response.

In the case that the frequency response of the output signal deviates from the predetermined slope value, for example as detected based on the sampling signal, the control circuit 424 is configured, according to an embodiment, to adjust the attenuation (i.e. the slope) S1 of the first equalizer 416 to compensate for said deviation. While this affects to the sum of A1+S1, the control circuit 424 is configured to adjust the attenuation A1 of the first attenuator 414 to a maximum value such the sum of the attenuations A1 and S1 of the first attenuator 414 and the first equalizer 416 is below said first threshold value. Then the control circuit 424 is configured to adjust the attenuation A2 of the second attenuator 420 such that the total attenuation reaches the target value. Thus, the upstream output signal is now adjusted to a predetermined level and with a predetermined slope value so that the next CATV amplifier is provided with an input signal with a fixed signal level and with a flat frequency response.

It is possible that the maximum adjustment of the attenuation (i.e. the slope) S1 of the first equalizer 416 is not enough to compensate for the deviation of the frequency response of the output signal from the predetermined slope value.

Therefore, it is advisable to provide the network element with the second equalizer 422. Thus, according to an embodiment, in a case where the attenuation S1 of the first equalizer 416 is set a maximum allowable value and the frequency response of the output signal still deviates from the predetermined slope value, the control circuit 424 is configured to adjust the attenuation S2 of the second equalizer 422 to compensate for said deviation. While this affects to the total attenuation, the control circuit 424 is configured to repeat the above steps, i.e. to adjust the attenuation A1 of the first attenuator 414 to a maximum value such the sum A1+S1 of the attenuations of the first attenuator 414 and the first equalizer 416 is below said first threshold value and to adjust the attenuation A2 of the second attenuator 420 such that the total attenuation reaches the target value.

According to an embodiment, the network element comprises means for adjusting, prior to determining the target value for the total attenuation, total gain of the amplifier to a predetermined level. Thus, the control circuit 424 may be configured to adjust, prior to determining the target value for the total attenuation, total gain of the amplifier to a predetermined level. The need for the attenuation is dependent from the total gain of the amplifier, i.e. the gain components G1 of the first amplifier stage 412 and G2 of the second amplifier stage 418. The control circuit 424 may obtain the gain values G1 and G2 from the memory 426, where they could be set as default values. Alternatively, the gain values G1 and G2 may be set, e.g. by a field technician, via the user interface 428 of the network element and provided to the control circuit 424. In the process of adjusting the gain values G1 and G2, the above considerations about the noise figures NF1 and NF2 are preferably taken into account.

According to an embodiment, the control circuit 424 is configured to adjust said first threshold value to be lower than the gain G1 of the first amplifier stage 414. Consequently, for ensuring that the input level of the output amplifier stage remains higher than the input level of the input amplifier stage, the first threshold value is set lower than the gain G1 of the first amplifier stage.

According to an embodiment, the control circuit 424 is configured to determine said target value for the total attenuation of the components of the amplifier at low frequencies of the upstream frequency band, such as within a range of 5-65 MHz. As mentioned above, the impact of the slope adjustment of the frequency-dependent equalizers S1 and S2 at lower frequencies to the total attenuation is thereby better addressed.

According to an embodiment, the network element comprises a computer program code, stored in a non-transitory memory means, for controlling the control circuit to carry out said adjustments. Thus, the logic underlying the embodiments may be implemented by a computer program executing an algorithm for the adjustments. The computer program code may be stored, e.g. in the memory 426, or it may be stored in a separate memory. The control circuit 424 may be implemented as a central processing unit (CPU), i.e. a microprocessor, and it may be configured to execute the computer program code. Alternatively, the network element may comprise a separate CPU for execute the computer program code and providing the control signals to the control circuit 424.

The embodiments may be illustrated by the following example. Upon installing the network element in the CATV network, or adjusting a prior installed network element, the total gain of the amplifier (i.e. the sum G1+G2) is set to a predetermined level. Based on this, it is determined that the need for the total attenuation is 22 dB in order to achieve the predetermined output signal level. The first threshold value, i.e. the maximum allowable value for the sum of the attenuations A1+S1 of the first attenuator 414 and the first equalizer 416, is set as 10 dB. Consequently, 10 dB attenuation is allocated by the algorithm to the first attenuator 414, and 12 dB attenuation is allocated to the second attenuator 420.

However, it is noticed that for compensating the cable attenuation towards the next CATV amplifier, a slope adjustment of 5 dB is needed. The algorithm adjusts the first equalizer 416 by 5 dB, whereupon the algorithm automatically reduces the attenuation of the first attenuator 414 to the value of 5 dB so as to prevent the noise figure NF1 to raise too much. As a result, 17 dB attenuation is allocated to the second attenuator 420. Consequently, the attenuation components of the total attenuation are inter-related and an adjustment of one attenuation component automatically affects to the other attenuation components. The algorithm preferably ensures that maximum allowable value for the sum of the attenuations A1+S1 of the mid-stage controls, i.e. the first attenuator 414 and the first equalizer 416, is used. It is noted that if the network element comprises the second equalizer 422, the possible slope adjustment may be divided between the first and the second equalizer, as described above.

In general, the various embodiments may be implemented in hardware or special purpose circuits or any combination thereof. While various embodiments may be illustrated and described as block diagrams or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

A skilled person appreciates that any of the embodiments described above may be implemented as a combination with one or more of the other embodiments, unless there is explicitly or implicitly stated that certain embodiments are only alternatives to each other.

The various embodiments can be implemented with the help of computer program code that resides in a memory and causes the relevant apparatuses to carry out the invention. Thus, the implementation may include a computer readable storage medium stored with code thereon for use by an apparatus, such as the network element, which when executed by a processor, causes the apparatus to perform the various embodiments or a subset of them. In addition or alternatively, the implementation may include a computer program embodied on a non-transitory computer readable medium, the computer program comprising instructions causing, when executed on at least one processor, at least one apparatus to perform the various embodiments or a subset of them. For example, an apparatus may comprise circuitry and electronics for handling, receiving and transmitting data, computer program code in a memory, and a processor that, when running the computer program code, causes the apparatus to carry out the features of an embodiment.

It will be obvious for a person skilled in the art that with technological developments, the basic idea of the invention can be implemented in a variety of ways.

Thus, the invention and its embodiments are not limited to the above-described examples, but they may vary within the scope of the claims.

The invention claimed is:

1. A method for controlling upstream signal path components of an amplifier of a cable television (CATV) network element, wherein the upstream signal path components comprise at least a first and a second amplifier stage, a first attenuator and a first equalizer between the first and the second amplifier stage, and a second attenuator after the second amplifier stage in an upstream signal path direction, the method comprising:

determining a target value for total attenuation of the components of the amplifier, wherein the total attenuation is a sum of attenuations of the first attenuator, the first equalizer, and the second attenuator, wherein the attenuation of the first equalizer is preset;

setting the attenuation of the first attenuator to a maximum value such that a sum of the attenuations of the first attenuator and the first equalizer is below a first threshold value;

setting the attenuation of the second attenuator such that the total attenuation reaches the target value; and providing an output signal from an output of the amplifier.

2. The method according to claim 1, further comprising:

adjusting, in response to a frequency response of the output signal deviating from a predetermined slope value, the attenuation of the first equalizer to compensate for said deviation;

adjusting the attenuation of the first attenuator to the maximum value such that the sum of the attenuations of the first attenuator and the first equalizer is below said first threshold value; and adjusting the attenuation of the second attenuator such that the total attenuation reaches the target value.

3. The method according to claim 1, wherein the upstream signal path components further comprise a second equalizer having a preset attenuation affecting the total attenuation and a maximum allowable value is set for the attenuation of the first equalizer, further comprising:

adjusting, in response to a frequency response of the output signal deviating from a predetermined slope value and the attenuation of the first equalizer having reached its maximum allowable value, the attenuation of the second equalizer to compensate for said deviation;

adjusting the attenuation of the first attenuator to the maximum value such that the sum of the attenuations of the first attenuator and the first equalizer is below said first threshold value; and adjusting the attenuation of the second attenuator such that the total attenuation reaches the target value.

4. The method according to claim 1, further comprising:

adjusting, prior to determining the target value for the total attenuation, a sum of a gain of the first amplifier stage and a gain of the second amplifier stage of the amplifier to a predetermined level.

5. The method according to claim 4, wherein said first threshold value is lower than the gain of the first amplifier stage.

6. The method according to claim 1, wherein said target value for the total attenuation of the components of the amplifier is determined at low frequencies of an upstream frequency band.

7. A non-transitory computer readable storage medium stored with code thereon, which when executed by a control circuit of the CATV network element in claim 1, causes the CATV network element to perform the method according to claim 1.

8. A network element of a cable television (CATV) network, said network element comprising at least a first and a second upstream amplifier stage, a first attenuator and a first equalizer between the first and the second upstream amplifier stage, and a second attenuator after the second upstream amplifier stage in an upstream signal path direction;

a control circuit configured to determine a target value for total attenuation of components of the amplifier, wherein the total attenuation is a sum of attenuations of the first attenuator, the first equalizer, and the second attenuator, wherein the attenuation of the first equalizer is preset;

the control circuit being configured to set the attenuation of the first attenuator to a maximum value such that a sum of the attenuations of the first attenuator and the first equalizer is below a first threshold value;

the control circuit being configured to set the attenuation of the second attenuator such that the total attenuation reaches the target value; and the network element comprising an output port configured to provide an upstream output signal.

9. The network element according to claim 8, wherein:

the control circuit is configured to adjust, in response to a frequency response of the output signal deviating from a predetermined slope value, the attenuation of the first equalizer to compensate for said deviation;

the control circuit is configured to adjust the attenuation of the first attenuator to the maximum value such that the sum of the attenuations of the first attenuator and the first equalizer is below said first threshold value; and the control circuit is configured to adjust the attenuation of the second attenuator such that the total attenuation reaches the target value.

10. The network element according to claim 8, wherein the network element further comprises a second equalizer having a preset attenuation affecting the total attenuation and a maximum allowable value is set for the attenuation of the first equalizer; wherein:

the control circuit is configured to adjust, in response to a frequency response of the output signal deviating from a predetermined slope value and the attenuation of the first equalizer having reached its maximum allowable value, the attenuation of the second equalizer to compensate for said deviation;

the control circuit is configured to adjust the attenuation of the first attenuator to the maximum value such that the sum of the attenuations of the first attenuator and the first equalizer is below said first threshold value; and the control circuit is configured to adjust the attenuation of the second attenuator such that the total attenuation reaches the target value.

11. The network element according to claim 8, wherein:

the control circuit is configured to adjust, prior to determining the target value for the total attenuation, a sum of a gain of the first amplifier stage and a gain of the second amplifier stage of the amplifier to a predetermined level.

12. The network element according to claim 11, wherein said first threshold value is lower than the gain of the first upstream amplifier stage.

13. The network element according to claim 8, wherein said target value for the total attenuation of the components of the amplifier is configured to be determined at low frequencies of an upstream frequency band.

14. The network element according to claim 8, comprising a computer program code, stored in a non-transitory memory means, for controlling the control circuit as set forth in claim 8.

* * * * *